(12) United States Patent
Feng et al.

(10) Patent No.: US 12,732,181 B2
(45) Date of Patent: Sep. 8, 2026

(54) GATE DRIVER FOR THRESHOLD VOLTAGE DETECTION AND COMPENSATION

(71) Applicant: Kabushiki Kaisha Toshiba, Tokyo (JP)

(72) Inventors: Zhengyang Feng, Bristol (GB); Manish Kumar, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

(21) Appl. No.: 19/036,543

(22) Filed: Jan. 24, 2025

(65) Prior Publication Data

US 2026/0221964 A1 Jul. 30, 2026

(51) Int. Cl.
*H03K 17/0812* (2006.01)

(52) U.S. Cl.
CPC . *H03K 17/08122* (2013.01); *H03K 17/08128* (2013.01)

(58) Field of Classification Search
None
See application file for complete search history.

(56) References Cited

U.S. PATENT DOCUMENTS 11,239,839 B2 2/2022 Li et al.
11,258,383 B2 2/2022 Watkins
11,515,872 B1 11/2022 Sandell
11,558,054 B1 1/2023 Wang
12,580,554 B2 * 3/2026 Feng ...................... H03K 3/011
2025/0004020 A1 * 1/2025 Letor ................ G01R 31/2621

OTHER PUBLICATIONS

U.S. Appl. No. 18/601,422, filed Mar. 11, 2024, Feng et al.
Dymond et al., "A 6.7-GHz Active Gate Driver for GaN FETs to Combat Overshoot, Ringing, and EMI", IEEE Transactions on Power Electronics, vol. 33, No. 1, Jan. 2018, 14 pages, doi: 10.1109/TPEL.2017.2669879.
Shorten et al., "A Segmented Gate Driver IC for the Reduction of IGBT Collector Current Over-Shoot at Turn-on", 25th International Symposium on Power Semiconductor Devices & IC's (ISPSD) 2013, 4 pages, doi: 10.1109/ISPSD.2013.6694400.
Raviola et al., "A Critical Assessment of Open-Loop Active Gate Drivers Under Variable Operating Conditions", 2021 IEEE International Joint EMC/SI/PI and EMC Europe Symposium, 2021, 6 pages, doi: 10.1109/EMC/SI/PI/EMCEurope52599.2021.9559173.

(Continued)

*Primary Examiner* — Cassandra F Cox
(74) *Attorney, Agent, or Firm* — Oblon, McClelland, Maier & Neustadt, L.L.P.

(57) ABSTRACT

A gate driver for a power semiconductor device. The gate driver includes a detection circuit arranged to detect a threshold voltage of a power semiconductor device, and a gate drive circuit arranged to provide, based at least in part on the threshold voltage detected by the detection circuit, a drive signal to the power semiconductor device for operating the power semiconductor device. The drive signal has a waveform shaped to compensate for deviation or variation of the threshold voltage from a nominal threshold voltage for the power semiconductor device.

20 Claims, 6 Drawing Sheets

(56) References Cited

OTHER PUBLICATIONS

Raviola et al., "An Adaptive Method to Reduce Undershoots and Overshoots in Power Switching Transistors Through a Low-Complexity Active Gate Driver", IEEE Transactions on Power Electronics, vol. 38, No. 3, Mar. 2023, 11 pages, doi: 10.1109/TPEL.2022.3221187.

Cheng et al., "High-Speed Searching of Optimum Switching Pattern for Digital Active Gate Drive to Adapt to Various Load Conditions", IEEE Transactions on Industrial Electronics, vol. 69, No. 5, May 2022, 10 pages, doi: 10.1109/TIE.2021.3084169.

Ling et al., "A Self-Regulating Gate Driver for High-Power IGBTs", IEEE Transactions on Power Electronics, vol. 36, No. 3, Mar. 2021, 12 pages, doi: 10.1109/TPEL.2020.3015924.

"UCC5870-Q1 30-A Isolated IGBT/SiC MOSFET Gate Driver with Advanced Protection Features for Automotive Applications", Texas Instruments, Oct. 2019, Revised Sep. 2021, 118 pages.

* cited by examiner

GATE DRIVER FOR THRESHOLD VOLTAGE DETECTION AND COMPENSATION

TECHNICAL FIELD

Embodiments described herein relate to a gate driver for a power semiconductor device.

BACKGROUND

Power semiconductor devices are used in industrial applications such as renewable energy systems and electrical vehicles.

A power semiconductor device is typically operated by a gate driver. The gate driver is arranged to provide suitable voltage and/or current to the power semiconductor device, to control the switching (e.g., the turning on and turning off) of the power semiconductor device. Ideally, the gate driver should switch the power semiconductor on and off quickly, efficiently, and safely.

One type of gate driver is active gate driver (AGD, which may also be referred to as a digital gate driver). Unlike a conventional gate driver which applies a drive signal with a constant waveform to switch the power semiconductor device, an active gate driver uses a drive signal with a shaped waveform to switch the power semiconductor device. The use of drive signal with shaped waveform may provide desired switching performance (e.g., trade-off between voltage/current overshoot and switching loss) and/or may provide desired efficiency and electromagnetic compatibility (EMC) performance in a system that includes the power semiconductor device.

In practice, various operation parameters of the power semiconductor device are susceptible to unintended variation (in particular, deviation or variation from nominal value(s)). Such unintended variation may be caused by, e.g., manufacturing tolerance and/or error, ageing or deterioration of the power semiconductor device, or operation condition (e.g., operating voltage, operating temperature) of the power semiconductor device. One operation parameter susceptible to such unintended variation is the threshold voltage, which corresponds to a minimum (gate) voltage required to turn on the power semiconductor device. The unintended variation of the threshold voltage, and in particular its deviation or variation from nominal threshold voltage value, may undesirably affect the switching performance of the power semiconductor device.

BRIEF DESCRIPTION OF THE DRAWINGS

Embodiments will now be described, with reference to the accompanying drawings, in which.

DETAILED DESCRIPTION

Figures 1, 2:
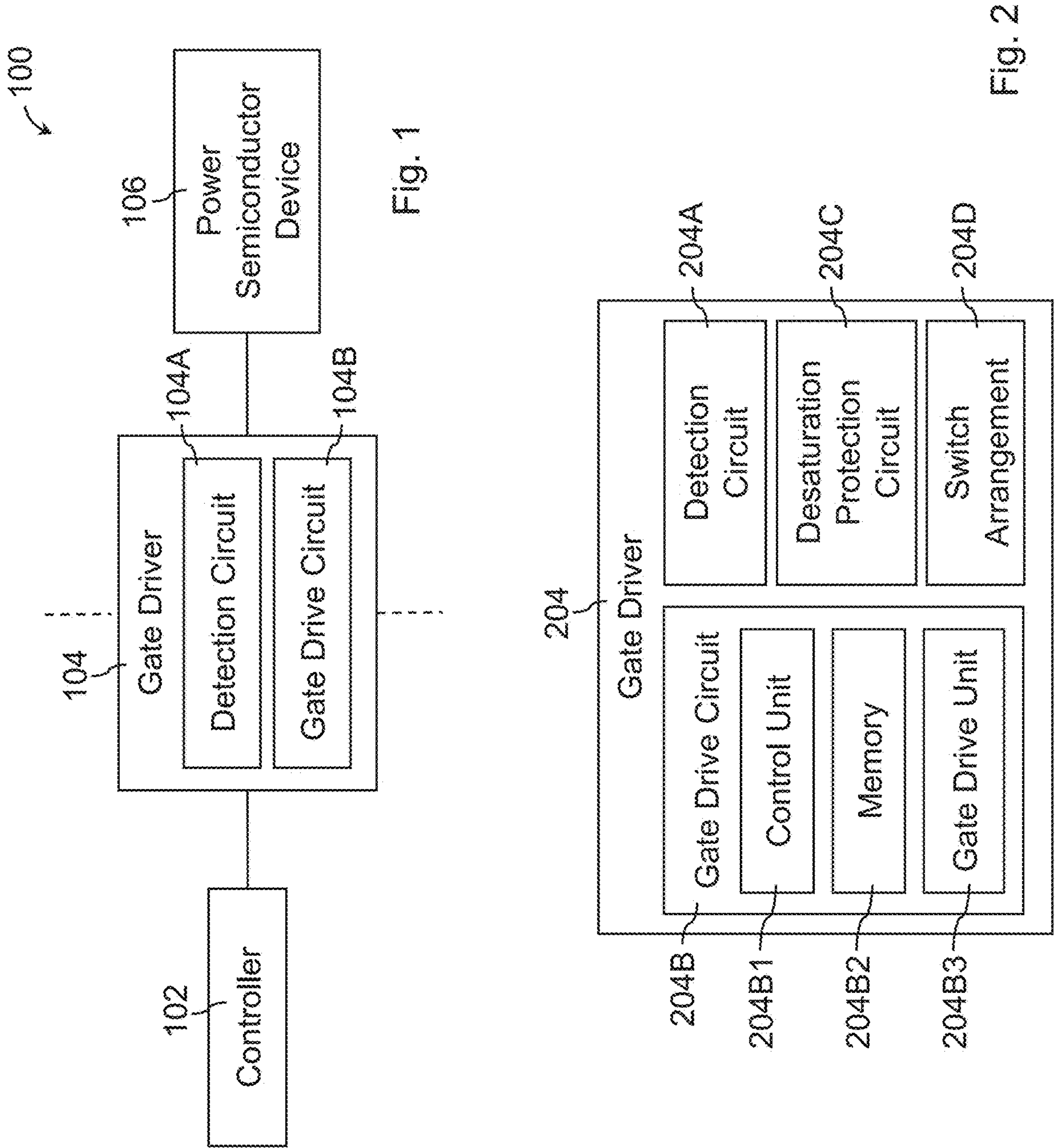
FIG. 1 is a schematic block diagram illustrating a system with a gate driver in one embodiment.
FIG. 2 is a schematic block diagram illustrating a gate driver in one embodiment.

According to a first aspect, there is provided a gate driver for a power semiconductor device. The gate driver comprises a detection circuit arranged to detect a threshold voltage of a power semiconductor device, and a gate drive circuit arranged to provide, based at least in part on the threshold voltage detected by the detection circuit, a drive signal to the power semiconductor device for operating the power semiconductor device. The drive signal has a waveform shaped to compensate for a deviation or variation of the threshold voltage from a nominal threshold voltage for the power semiconductor device.

The gate drive circuit may comprise: a memory storing a gate drive pattern, a control unit arranged to modify the gate drive pattern based at least in part on the threshold voltage detected by the detection circuit, and a gate drive unit arranged to generate the drive signal based at least in part on the gate drive pattern modified by the control unit and to provide the drive signal to the power semiconductor device.

The control unit may be arranged to control the detection circuit to facilitate detection of the threshold voltage of the power semiconductor device.

The gate drive unit may comprise a current source or a voltage source arranged to provide the drive signal.

The power semiconductor device may comprise a gate terminal, a first terminal, and a second terminal. The threshold voltage may be substantially equal to a minimum gate voltage required to create or provide a conducting channel between the first terminal and the second terminal.

The gate driver may further comprise a switch arrangement that is operable in a first state, to electrically connect the gate terminal of the power semiconductor device and the first terminal of the power semiconductor device such that the gate terminal and the first terminal are electrically shorted and to allow flow of current from a current source to the gate terminal of the power semiconductor device, and in a second state, to electrically disconnect the gate terminal of the power semiconductor device and the first terminal of the power semiconductor device such that the gate terminal and the first terminal are not electrically shorted and to prevent flow of current from the current source to the gate terminal of the power semiconductor device.

The control unit may be arranged to perform the following to facilitate detection of the threshold voltage of the power semiconductor device: operate the switch arrangement in the first state to allow flow of current from the current source to the gate terminal of the power semiconductor device such that gate voltage of the power semiconductor device can reach the threshold voltage, and operate the detection circuit to detect a gate voltage of the power semiconductor device when the gate voltage is at the threshold voltage.

The control unit may be further arranged to perform the following to facilitate detection of the threshold voltage of the power semiconductor device: control or operate the current source to provide the flow of current to the gate terminal of the power semiconductor device.

The gate drive unit may comprise the current source.

The gate driver may further comprise a desaturation protection circuit arranged to provide short circuit protection for the power semiconductor device. The desaturation protection circuit may comprise the current source. The current source may be operable to provide current to a capacitor for preventing false fault triggering when a fault condition of the power semiconductor device is detected.

The detection circuit may comprise: a first detector for detecting electrical characteristic associated with the first terminal and/or the second terminal of the power semiconductor device, the electrical characteristic representing an operation condition of the power semiconductor device, and a second detector for detecting the gate voltage of the power semiconductor device.

The memory may store a plurality of gate drive patterns. The control unit may be arranged to select the gate drive pattern from the plurality of gate drive patterns based at least in part on the detected electrical characteristic associated with the first terminal and/or the second terminal of the power semiconductor device and to modify the gate drive pattern based at least in part on the threshold voltage detected by the detection circuit. The gate drive unit may be arranged to generate the drive signal based at least in part on the selected and modified gate drive pattern and to provide the drive signal to the power semiconductor device.

The power semiconductor device may comprise a metal oxide semiconductor field effect transistor (MOSFET), the first terminal may be a drain terminal, and the second terminal may be a source terminal.

The power semiconductor device may comprise an insulated gate bipolar transistor (IGBT), the first terminal may be an emitter terminal, and the second terminal may be a collector terminal.

According to a second aspect, there is provided an integrated circuit comprising the gate driver of the first aspect. The integrated circuit may further comprise the power semiconductor device.

According to a third aspect, there is provided a system comprising the gate driver according to the first aspect and a controller operably connected with the gate driver. The detection circuit is arranged to provide the detected threshold voltage to the controller. The controller is arranged to compare the detected threshold voltage with the nominal threshold voltage and to provide, based at least in part on the comparison, a signal to the gate drive circuit. The gate drive circuit is arranged to provide the drive signal based at least in part on the signal received from the controller.

The controller may be arranged to provide an initiation signal to the gate driver circuit to initiate detection of the threshold voltage of the power semiconductor device.

The system may further comprise the power semiconductor device operably connected with the gate driver.

According to a fourth aspect, there is provided a method for controlling operation of a power semiconductor device. The method comprises detecting, using a gate driver, a threshold voltage of a power semiconductor device; and providing, using the gate driver and based at least in part on the detected threshold voltage, a drive signal to the power semiconductor device for operating the power semiconductor device. The drive signal has a waveform shaped to compensate for a deviation or variation of the threshold voltage from a nominal threshold voltage for the power semiconductor device.

The method may further comprise: modifying a gate drive pattern stored in a memory of the gate driver based at least in part on the detected threshold voltage; and generating, at the gate driver, the drive signal based at least in part on the modified gate drive pattern.

FIG. 1 shows a system 100 in one embodiment. The system 100 includes a controller 102, a gate driver 104 operably connected with the controller 102, and a power semiconductor device 106 operably connected with the gate driver 104. The controller 102 and the gate driver 104 are connected directly or indirectly via electrical connection. The gate driver 104 and the power semiconductor device 106 are connected directly or indirectly via electrical connection. The controller 102 is operable to control operation of the gate driver 104, and the gate driver 104 is operable to operate (e.g., turn on and/or off) the power semiconductor device. The gate driver 104 provides isolation between the controller 102 and the power semiconductor device 106.

The controller 102 includes a processor and a memory. The processor may include one or more: CPU(s), MCU(s), MPU(s), TPU(s), NPU(s), GPU(s), logic circuit(s), Raspberry Pi chip(s), digital signal processor(s) (DSP), application-specific integrated circuit(s) (ASIC), field-programmable gate array(s) (FPGA), digital circuitry/circuitries, and/or analog circuitry/circuitries. The processor is configured to interpret program instructions, execute program instructions, and/or process signals, information, and/or data. The memory may include one or more volatile memory (such as RAM, DRAM, SRAM, etc.), one or more non-volatile memory (such as ROM, PROM, EPROM, EEPROM, FRAM, MRAM, FLASH, SSD, NAND, NVDIMM, etc.), or any of their combinations. The memory is configured to store appropriate program instructions, commands, codes, information, and/or data. For example, the memory may store program instructions for performing or facilitating one or more operation(s) in this disclosure. The processor and the memory may be integrated or separated.

The power semiconductor device 106 includes a field effect transistor (FET).

In one embodiment, the power semiconductor device 106 includes an insulated gate bipolar transistor (IGBT), which includes an emitter terminal (electrode), a collector terminal (electrode), and a gate terminal (electrode). The IGBT has a threshold voltage (also referred to as gate threshold voltage), which corresponds to the minimum gate voltage (i.e., minimum gate-emitter voltage $V_{ge}$) required to create or otherwise provide a conducting channel between the collector terminal and the emitter terminal. The IGBT may be a P-channel IGBT or an N-channel IGBT.

In one embodiment, the power semiconductor device 106 includes a metal oxide semiconductor field effect transistor (MOSFET), which includes a gate terminal (electrode), a drain terminal (electrode), and a source terminal (electrode). The MOSFET has a threshold voltage (also referred to as gate threshold voltage), which corresponds to the minimum gate voltage (i.e., minimum gate-source voltage $V_{gs}$) required to create or otherwise provide a conducting channel between the source terminal and drain terminal. The MOSFET may be a P-channel MOSFET or an N-channel MOSFET.

The gate driver 104 includes one or more circuits suitable for operating, in particular driving, the power semiconductor device 106. The circuit(s) may include active and/or passive circuit components. The gate driver 104 is an active gate driver arranged to provide drive signals with shaped (non-constant) waveforms to switch (turn on and/or off) the power semiconductor device 106.

The gate driver 104 includes a detection circuit 104A and a gate drive circuit 104B. The detection circuit 104A is arranged to detect a threshold voltage of the power semiconductor device 106. The detection circuit 104A may be arranged to detect a load condition of the power semiconductor device 106. The gate drive circuit 104B is arranged to provide a drive signal to the power semiconductor device based at least in part on the detected threshold voltage. The gate drive circuit 104B may be arranged to provide a drive signal to the power semiconductor device 106 based at least in part on the detected threshold voltage and the load condition of the power semiconductor device 106. The drive signal has a waveform shaped to compensate for an undesired deviation or variation of the threshold voltage from a reference threshold voltage for the power semiconductor device 106. The reference threshold voltage for the power semiconductor device 106 may be a nominal or typical threshold voltage for the power semiconductor device 106, which is determined during design, manufacture, and/or post-manufacture testing of the power semiconductor device 106. The nominal or typical threshold voltage may be found in a product datasheet of the power semiconductor device 106 (typically provided by the manufacturer of the power semiconductor device 106).

The gate drive circuit 104B is arranged to provide the drive signal with the shaped waveform to the power semiconductor device 106 to switch the power semiconductor device 106 so as to achieve a desired switching performance (e.g., trade-off between voltage/current overshoot and switching loss). More specifically, the gate drive circuit 104B is arranged to provide the drive signal with the shaped waveform to the power semiconductor device 106 to drive the power semiconductor device 106 and compensate for any undesired deviation or variation of the threshold voltage from the reference threshold voltage.

In one embodiment, the gate drive circuit 104B is arranged to control the operation of the detection circuit 104A to facilitate detection of the threshold voltage of the power semiconductor device 106. The gate drive circuit 104B may be arranged to control the operation of the detection circuit 104A to facilitate detection of the load condition of the power semiconductor device 106. For example, the gate drive circuit 104B may be configured to control when the detection circuit 104A should operate to detect the threshold voltage of the power semiconductor device 106 and optionally when the detection circuit 104A should operate to detect the load condition of the power semiconductor device 106. In another embodiment, the detection circuit 104A may be controlled by another circuit or component to facilitate detection of the threshold voltage of the power semiconductor device 106 and/or the load condition of the power semiconductor device 106.

The detection circuit 104A is arranged to provide the detected threshold voltage to the controller 102. The detection circuit 104A may be arranged to provide the detected load condition of the power semiconductor device 106 to the gate drive circuit 104B. The controller 102 is arranged to compare the detected threshold voltage with the reference threshold voltage and to provide, based at least in part on the comparison, a signal to the gate drive circuit 104B. The reference threshold voltage may be received by, accessed by, or stored in the controller 102, for facilitating performing of the comparison. The gate drive circuit 104B is arranged to generate and provide the drive signal based at least in part on the signal received from the controller 102. The gate drive circuit 104B may be arranged to generate and provide the drive signal based at least in part on the signal received from the controller 102 and the detected load condition of the power semiconductor device 106. The signal received from the controller 102 is arranged to affect the waveform (e.g., amplitude, duration, shape, etc.) of the drive signal provided by the gate drive circuit 104B.

In one embodiment, the controller 102 is arranged to provide an initiation signal to the gate driver 104 to initiate detection of the threshold voltage of the power semiconductor device 106.

Various modifications can be made to the system 100. For example, the controller 102 may be at least partly integrated with the gate driver 104. For example, one or more functions of the controller 102 may be performed by the gate driver 104. For example, one or more functions of the gate driver 104 may be performed by the controller 102.

In one implementation, the gate driver 104 is arranged in an integrated circuit (IC) or semiconductor package. In one implementation, the gate driver 104 and the power semiconductor device 106 are arranged in the same integrated circuit or semiconductor package. In one implementation, the gate driver 104 has discrete electronic components and is arranged in an electronic device or system. The gate driver 104, the controller 102, and the power semiconductor device 106 may be arranged in the same electronic device or system.

FIG. 2 shows a gate driver 204 in one embodiment. The gate driver 204 may be operably connected with a controller and a power semiconductor device. The gate driver 204 may be the gate driver 104 in the system 100.

The gate driver 204 includes a detection circuit 204A and a gate drive circuit 204B operably connected with each other. The function of the detection circuit 204A may be the same as the detection circuit 104A, and the function of the gate drive circuit 204B may be the same as the gate drive circuit 104B.

The detection circuit 204A is arranged to detect a threshold voltage of a power semiconductor device operably connected with the gate driver 204. For example, the gate driver 204 can operate the power semiconductor device such that its gate voltage is clamped substantially at the threshold voltage, and, when the gate voltage of the power semiconductor device is substantially at the threshold voltage, the detection circuit 204A can detect the gate/threshold voltage. The detection circuit 204A may be further arranged to detect at least one other electrical characteristic associated with one or more other terminals (not the gate terminal) of the power semiconductor device. The at least one other electrical characteristic may represent an operation (e.g., load) condition of the power semiconductor device. For example, if the power semiconductor device is a MOSFET, the electrical characteristic may include drain current of the MOSFET. For example, if the power semiconductor device is an IGBT, the electrical characteristic may include collector current of the IGBT. The detection circuit 204A may be electrically connected with the gate terminal and one or more other terminals of the power semiconductor device. The detection circuit 204A may communicate the detected threshold voltage and the at least one other electrical characteristic to a controller operably connected with the gate driver 204 and/or to the gate drive circuit 204B, to facilitate control and/or operation of the power semiconductor device. In one example, the detection circuit 204A may communicate the detected threshold voltage to the controller and the at least one other detected electrical characteristic of the power semiconductor device to the gate drive circuit 204B.

The gate drive circuit 204B includes a control unit 204B1, a memory 204B2, and a gate drive unit 204B3. The control unit 204B1, the memory 204B2, and the gate drive unit 204B3 are connected directly or indirectly via electrical connection.

The memory 204B2 stores one or more gate drive patterns. The control unit 204B1 is arranged to modify the gate drive pattern based at least in part on the threshold voltage detected by the detection circuit 204A. For example, if the memory 204B2 stores multiple gate drive patterns, the control unit 204B1 may be arranged to select one of the gate drive patterns stored in the memory 204B2 based at least in part on a load condition of the power semiconductor device (represented by the at least one other detected electrical characteristic of the power semiconductor device), and to modify the selected gate drive pattern based at least in part on the threshold voltage detected by the detection circuit 204A. The gate drive unit 204B3 is arranged to generate a drive signal based at least in part on the modified gate drive pattern and provide the drive signal to switch (turn on and/or off) the power semiconductor device. For example, the gate drive unit 204B3 may be arranged to generate a drive signal based at least in part on the selected and modified gate drive pattern and use the drive signal to switch (turn on and/or off) the power semiconductor device. The drive signal includes a waveform shaped to compensate for a deviation or variation of the threshold voltage from a reference (nominal or typical) threshold voltage for the power semiconductor device. For example, the detection circuit 204A may provide the detected threshold voltage to the controller operably connected with the gate driver 204. The detection circuit 204A may further provide the at least one other detected electrical characteristic of the power semiconductor device to the control unit 204B1. The controller may compare the detected threshold voltage with a reference threshold voltage (e.g., a threshold voltage the power semiconductor device is nominally designed to have) and provide, based at least in part on the comparison, a signal to the control unit 204B1. The reference threshold voltage may be received by, accessed by, or stored in the controller, to facilitate performing of the comparison. The control unit 204B1 may modify the gate drive pattern stored in the memory 204B2 based at least in part on the signal received from the controller. For example, the control unit 204B1 may select one of the gate drive patterns stored in the memory 204B2 based at least in part on a load condition of the power semiconductor device and modify the selected gate drive pattern based at least in part on the signal received from the controller. The signal received from the controller may affect the waveform (e.g., amplitude, duration, shape, etc.) of the drive signal provided by the gate drive unit 204B3 and in turn the threshold voltage of the power semiconductor device.

The gate drive unit 204B3 may include a power source arranged to provide the drive signal to a gate terminal of the power semiconductor device. The power source may include a current source or a voltage source. The gate drive unit 204B3 may include transistors (such as p-type metal-oxide-semiconductor (PMOS) transistors and/or n-type metal-oxide-semiconductor (NMOS) transistors electrically connected with each other, which provide the power source. The memory 204B2 may store one or more gate drive patterns. For example, the memory 204B2 may store a lookup table which includes at least one turn-on gate drive pattern and at least one turn-off gate drive pattern. Each gate drive pattern may be defined as $[N_1, T_1, N_2, T_2, \ldots, N_n, T_n]$, where N refers to the number of transistors to turn on in gate drive unit 3041, T refers to the corresponding turn on time, and n is an integer. The control unit 204B1 may select one of the gate drive patterns for use in generating the drive signal and/or modify one or more of the gate drive patterns (e.g., by modifying the values of N and/or T of the gate drive pattern). The control unit 204B1 and the memory 204B2 may together define a memory and logic control unit.

In one example in which the memory 204B2 stores more than one gate drive patterns, the control unit 204B1 may select one of the gate drive patterns stored in the memory 204B2 based at least in part on the at least one other electrical characteristic detected by the detection circuit 204A and modify the selected gate drive pattern based at least in part on the threshold voltage detected by the detection circuit 204A.

In another example in which the memory 204B2 stores more than one gate drive patterns, the control unit 204B1 may modify the gate drive patterns stored in the memory 204B2 based at least in part on the threshold voltage detected by the detection circuit 204A and select one of the modified gate drive patterns based at least in part on the at least one other detected electrical characteristic of the power semiconductor device (which represents the operation condition of the power semiconductor device and can be detected by the detection circuit 204A).

As shown in FIG. 2, the gate driver 204 further includes a desaturation protection circuit 204C and a switch arrangement 204D electrically connected with each other. The control unit 204B1 may be arranged to control operation of one or more of the desaturation protection circuit 204C and the switch arrangement 204D.

The desaturation protection circuit 204C is arranged to provide short circuit protection for the power semiconductor device. The desaturation protection circuit 204C may include a current source operable to provide current to an external capacitor to prevent false fault triggering when the power semiconductor device is in a fault condition (e.g., short circuit condition). The current source of the desaturation protection circuit 204C may be further operable to provide current to the gate terminal of the power semiconductor device.

The switch arrangement 204D may include one or more switches (e.g., transistors). The switch arrangement 204D is operable in at least two different states. In the first state, the switch arrangement 204D electrically connects a gate terminal of the power semiconductor device and another terminal of the power semiconductor device (e.g., drain terminal of a MOSFET or collector terminal of an IGBT) such that the two terminals are electrically shorted, and allows flow of current from a current source (e.g., current source of the desaturation protection circuit 204C or current source of the gate drive unit 204B3) to the gate terminal of the power semiconductor device. In the second state, the switch arrangement 204D electrically disconnects the gate terminal of the power semiconductor device and another terminal of the power semiconductor device (e.g., drain terminal of a MOSFET or collector terminal of an IGBT) such that the two terminals are not electrically shorted, and prevents flow of current from the current source (e.g., current source of the desaturation protection circuit 204C or current source of the gate drive unit 204B3) to the gate terminal of the power semiconductor device.

The control unit 204B1 may be arranged to facilitate detection of the threshold voltage of the power semiconductor device. For example, the control unit 204B1 may operate the switch arrangement 204D in the first state, to electrically connect a gate terminal and another terminal of the power semiconductor device (e.g., drain terminal of a MOSFET or collector terminal of an IGBT) such that they are electrically shorted, and then enable flow of current from the current source to the gate terminal of the power semiconductor device such that gate voltage of the power semiconductor device reaches the threshold voltage. The control unit 204B1 may operate the detection circuit 204A to detect the threshold voltage of the power semiconductor device when the gate voltage is at the threshold voltage. By electrically shorting the gate terminal and the other terminal of the power semiconductor device (e.g., drain terminal of a MOSFET or collector terminal of an IGBT), the gate voltage of the power semiconductor device, after it reaches the threshold voltage as a result of the flow of current from the current source to the gate terminal, will be clamped substantially at the threshold voltage even if the current source continues to provide current to the gate terminal of the power semiconductor device. The control unit 204B1 may be arranged to control the current source to provide the current so as to enable the current flow to the gate terminal of the power semiconductor device. In one example in which the gate driver 204 includes multiple current sources, the control unit 204B1 may select the current source for providing the current to the gate terminal of the power semiconductor device.

Various modifications may be made to the gate driver 204. For example, one or more components or modules of the gate driver 204 may be combined. For example, the gate driver 204 may include only one current source (e.g., either the current source of the desaturation protection circuit 204C or the current source of the gate drive unit 204B3). In one implementation, the gate driver 204 is arranged in an integrated circuit (IC) or a semiconductor package.

Figure 3:
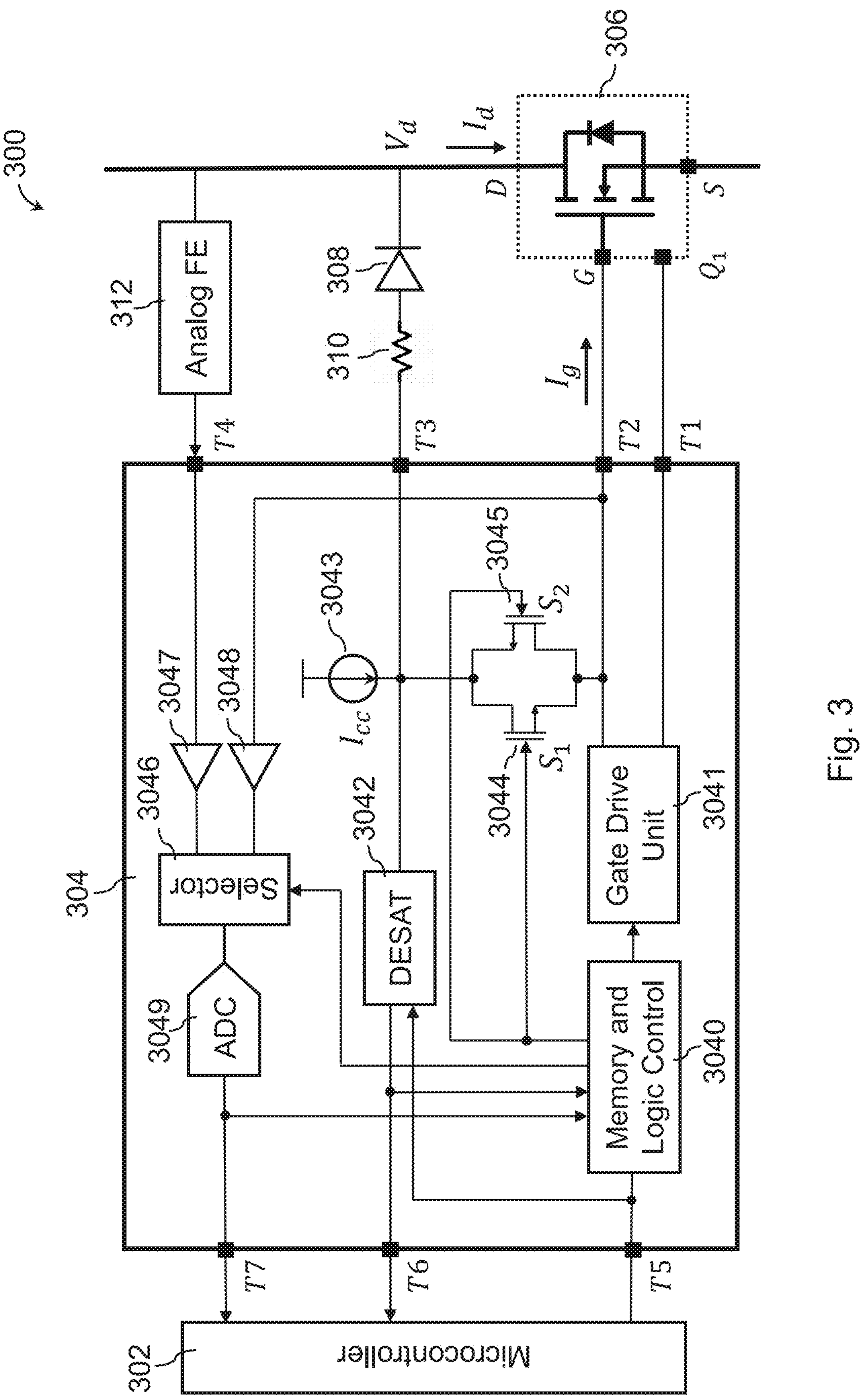
FIG. 3 is a simplified circuit diagram illustrating a circuit with an active gate driver in one embodiment.

FIG. 3 shows a circuit 300 in one embodiment. For simplicity, the circuit 300 only shows components relevant to the disclosure. The circuit 300 includes a microcontroller 302, an active gate driver 304, and a switch $Q_1$ provided by an N-channel MOSFET 306 (with gate, drain, and source terminals, and body diode shown). The active gate driver 304 is arranged to drive, in particular switch on and off, the MOSFET 306.

The circuit 300 may be considered as an example implementation of the system 100. Specifically, the microcontroller 302 may be considered as an example implementation of the controller 102. The active gate driver 304 may be considered as an example implementation of the gate driver 104, 204. For example, the MOSFET 306 may be considered as an example implementation of the power semiconductor device 106. In one implementation, the active gate driver 304 is arranged in a chip or an integrated circuit.

The active gate driver 304 includes a memory and logic control unit 3040 and a gate drive unit 3041. The memory and logic control unit 3040 may be considered as an example implementation of the control unit 204B1 and the memory 204B2. The gate drive unit 3041 may be considered as an example implementation of the gate drive unit 204B3.

The gate drive unit 3041 includes a CMOS array, which provides a voltage source or a current source. The memory and logic control unit 3040 stores a lookup table that includes four turn-on gate drive patterns and four turn-off gate drive patterns. Each gate drive pattern is defined as $[N_1, T_1, N_2, T_2 \ldots, N_n, T_n]$, where N refers to the number of transistors to turn on in the gate drive unit 3041, T refers to the corresponding turn on time, and n is an integer. The different turn-on gate drive patterns are arranged for different operation conditions (e.g., load conditions) of the MOSFET 306. The different turn-off gate drive patterns are arranged for different operation conditions (e.g., load conditions) of the MOSFET 306.

The memory and logic control unit 3040 is arranged to select, from the stored gate drive patterns, a suitable gate drive pattern based on a detected operation condition (e.g., load condition) of the MOSFET 306. In one example, the memory and logic control unit 3040 is arranged to select the gate drive pattern from the memory unit based on a detected drain current of the MOSFET 306 (which represents the load condition of the MOSFET 306 and e.g., may be detected via the analog front-end circuit 312 described below). The memory and logic control unit 3040 is further arranged to modify the selected gate drive pattern based on a signal received from the microcontroller 302 (as a result of the microcontroller 302 comparing a detected threshold voltage of the MOSFET 306 with a reference threshold voltage for the MOSFET 306), and to provide the selected and modified gate drive pattern to the gate drive unit 3041.

The gate drive unit 3041 is arranged to generate a shaped drive signal based on the gate drive pattern received from the memory and logic control unit 3040, and to provide a drive signal with a shaped waveform to drive the MOSFET 306. The gate drive unit 3041 is connected with the gate terminal and the source terminal of the MOSFET 306 via terminals T2 and T1 of the active gate driver 304, for performing active gate driving.

The active gate driver 304 also includes a desaturation protection circuit 3042 operable to provide short circuit protection for the MOSFET 306. The desaturation protection circuit 3042 is connected with a drain terminal of the MOSFET 306 via terminal T3 of the active gate driver 304, a resistor 310, and a high voltage (e.g., 600V, 1200V, 3300V, etc.) diode 308. The high voltage diode 308 is associated with the desaturation protection circuit 3042. The resistor 310 and the diode 308 are connected between the active gate driver 304 (terminal T3) and the drain terminal of the MOSFET 306. A cathode of the diode 308 is connected with a drain terminal of the MOSFET 306. The active gate driver 304 also includes a current source $I_{cc}$ 3043 associated with the desaturation protection circuit 3042. The current source $I_{cc}$ 3043 is connected to the anode of the diode 308 via terminal T3 and the resistor 310.

The active gate driver 304 also includes a switch arrangement with transistor switch $S_1$ 3044 and transistor switch $S_2$ 3045. The switches 3044, 3045 are connected in a reverse parallel manner. The operation of the switches 3044, 3045 is controlled by the memory and logic control unit 3040. The current source $I_{cc}$ 3043 is connected with the gate terminal of the MOSFET 306 via the switch arrangement. In one operation, when the switch 3044 is turned on, the current source $I_{cc}$ 3043 is electrically connected with the gate terminal of the MOSFET 306 for providing current to the gate terminal of the MOSFET 306, and a sensing node of the desaturation protection circuit 3042 is connected to the gate terminal of the MOSFET 306 via the switch 3044. In another operation, when the switch 3045 is turned on, the gate drive unit 3041 is electrically connected with the gate terminal of the MOSFET 306 for providing current to the gate terminal of the MOSFET 306, and a sensing node of the desaturation protection circuit 3042 is connected to the gate terminal of the MOSFET 306 via the switch 3045.

In a fault condition of the MOSFET 306, the current source $I_{cc}$ 3043 is arranged to charge an external capacitor (not shown) to provide a blanking time to prevent false fault trigging of the MOSFET 306, and the high voltage diode 308 is arranged to block high voltage from the drain terminal of the MOSFET 306.

The active gate driver 304 also includes an analog-to-digital converter (ADC) 3049 and a selector 3046 for the ADC 3049. The selector 3046 may be a multiplexer. The selector 3046 includes a first input connected with the drain terminal of the MOSFET 306 via terminal T4 and an analog front-end circuit 312. An amplifier 3047 is connected between the first input of the selector 3046 and terminal T4. The analog front-end circuit 312 is connected between the active gate driver 304 (terminal T4) and the drain terminal of the MOSFET 306. The analog front-end circuit 312 is operable to detect drain current of the MOSFET 306 (the drain current of the MOSFET 306 may represent a load condition of the MOSFET 306). The selector 3046 includes a second input connected with the gate terminal of the MOSFET 306 via terminal T2, for detecting a gate voltage of the MOSFET 306. An amplifier 3048 is connected between the second input of the selector 3046 and terminal T2. The ADC 3049 and the selector 3046 provide a detection circuit for detecting threshold voltage of the MOSFET 306 (by detecting the gate voltage of the MOSFET 306, e.g., by detecting the drain voltage of the MOSFET 306 when the gate and drain terminals of the MOSFET 306 are electrically shorted and the gate voltage is clamped substantially at the threshold voltage (i.e., the gate voltage and the drain voltage are substantially identical)). In this example, the detection of the threshold voltage of the MOSFET 306 is via terminal T2 and amplifier 3048.

The active gate driver 304 may have a voltage limit (e.g., 5V, 10V, 15V, 18V, etc.). The active gate driver 304 may have overvoltage protection that is activated when the gate voltage of the MOSFET 306 exceeds this voltage limit.

The memory and logic control unit 3040 is arranged to receive signal (e.g., signal containing information on the detected gate/threshold voltage or the detected drain current) from the ADC 3049, receive signal (e.g., signal to turn off the MOSFET 306 using a suitable turn off gate drive pattern when a fault condition is detected) from the desaturation protection circuit 3042, and receive signal (e.g., data, command) from the microcontroller 302. The memory and logic control unit 3040 is arranged to provide signal (e.g., gate drive pattern) to the gate drive unit 3041, provide signal (e.g., control signal) to the switches 3044, 3045, and provide signal (e.g., control signal) to the selector 3046 to facilitate detection of the threshold voltage of the MOSFET 306. The memory and logic control unit 3040 is arranged to cooperate with the microcontroller 302, to control or coordinate operation of the active gate driver 304.

The microcontroller 302 is arranged to receive output signal (e.g., the detected gate/threshold voltage or the detected drain current) from the ADC 3049 via terminal T7, and receive output signal from the desaturation protection circuit 3042 via terminal T6. The microcontroller 302 is arranged to provide signal (e.g., PWM signal, clock signal) to the memory and logic control unit 3040 and to provide signal (e.g., control signal) to the desaturation protection circuit 3042, via terminal T5.

Various modifications may be made to the circuit 300. For example, one or more components or modules of the gate driver 304 may be combined. For example, the gate driver 304 may include only one current source (e.g., either the current source 3043 or the current source of the gate drive unit 3041).

Figure 4:
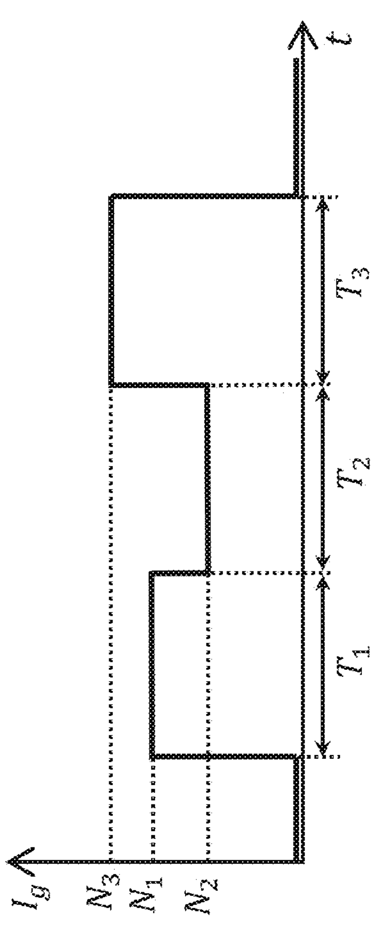
FIG. 4 is a graph showing a drive signal that can be provided by the active gate driver in the circuit of FIG. 3 in one embodiment.

FIG. 4 shows an example drive signal that can be provided by the active gate driver 304. The drive signal includes a shaped (non-constant) waveform and is output by the gate drive unit 3041. In this example, a gate drive pattern of [$N_1$, T1, $N_2$, T2, $N_3$, T3] is stored in the memory and logic control unit 3040, and the shaped waveform of the drive signal is a 3-step drive waveform as shown in FIG. 4 (the y-axis of the graph shows the amplitudes for gate current, i.e., the current output by the gate drive unit 3041 and applied to the gate of the MOSFET 306).

Figure 5:
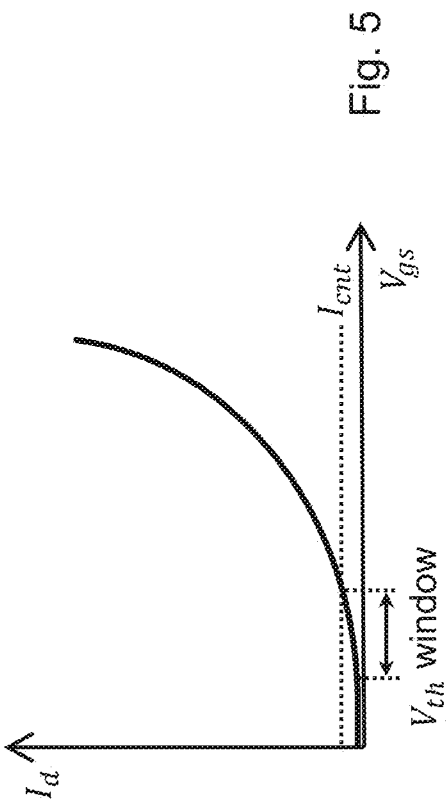
FIG. 5 is a graph showing example transfer characteristics of the power semiconductor device in the circuit of FIG. 3.

FIG. 5 is a graph showing transfer characteristics of the MOSFET 306 in the circuit 300 in one embodiment. The solid line in the graph shows the relationship between the drain current $I_d$ and gate voltage (i.e., gate-source voltage $V_{gs}$) of the MOSFET 306.

When the drain terminal and the gate terminal of the MOSFET 306 are electrically shorted, the MOSFET 306 enters into a diode mode in which the MOSFET 306 behaves like a diode (i.e., allows flow of current from the drain terminal to the source terminal). When the MOSFET 306 is in the diode mode, a constant and small current $I_{cnt}$ (dotted line) can be provided either from the current source $I_{cc}$ or the gate drive unit 3041 to the gate terminal of the MOSFET 306 to charge the MOSFET 306, such that the gate-source voltage $V_{gs}$ can reach the threshold voltage $V_{th}$. When the gate-source voltage $V_{gs}$ reaches the threshold voltage $V_{th}$, the MOSFET 306 turns on, and a conducting channel is formed in the MOSFET 306. The gate current $I_{cnt}$ can then flow through the conducting channel of the MOSFET 306, the drain current of the MOSFET 306 will be equal to $I_{cnt}$, and the gate voltage is clamped substantially at the threshold voltage $V_{th}$.

In FIG. 5, when the drain current $I_d=I_{cnt}$, the intersection between solid line and the dotted line corresponds to the gate-source voltage $V_{gs}$. In theory, the threshold voltage $V_{th}$ is the value when $I_d=0$ A. However, in practice, as $I_{cnt}$ is very small (usually in the order of milli-ampere (mA)), the gate-source voltage $V_{gs}$ at the intersection is sufficiently close to the theoretical threshold voltage $V_{th}$ value. In this case, any value within a small threshold voltage $V_{th}$ values window can represent the actual threshold voltage $V_{th}$ of the MOSFET 306.

Figure 6:
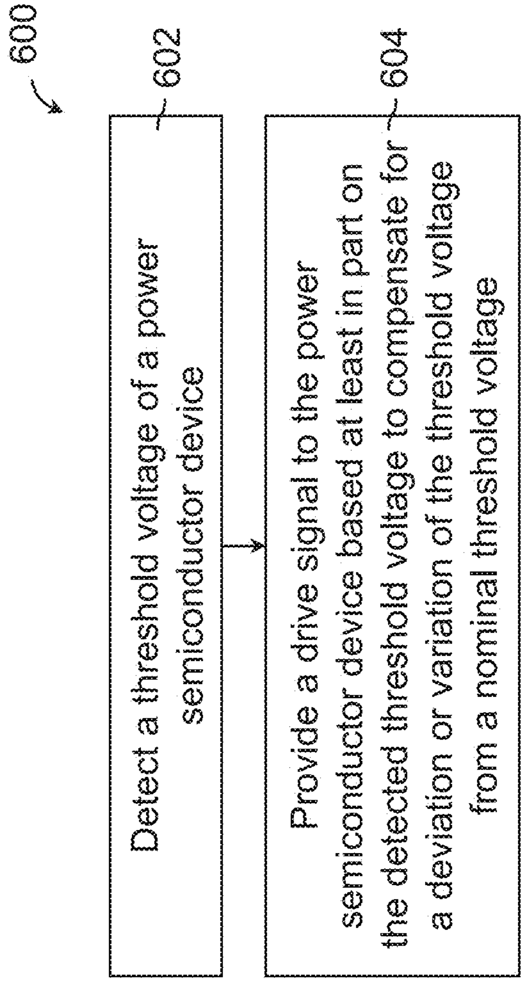
FIG. 6 is a flowchart illustrating a threshold voltage detection and compensation operation in one embodiment.

FIG. 6 shows a threshold voltage detection and compensation operation 600 in one embodiment. The operation 600 is performed by a gate driver, such as the gate driver 104, 204, 304, and is arranged to detect a threshold voltage of a power semiconductor device and compensate for a deviation or variation of the threshold voltage from a nominal threshold voltage for the power semiconductor device.

The operation 600 includes, in 602, detecting a threshold voltage of a power semiconductor device, and in 604, providing a drive signal to the power semiconductor device based at least in part on the detected threshold voltage to compensate for a deviation or variation of the threshold voltage from a nominal threshold voltage. The operation 600 may further include, after 602 and before 604, modifying a gate drive pattern stored in a memory of the gate driver based at least in part on the detected threshold voltage, and generating, at the gate driver, the drive signal based at least in part on the modified gate drive pattern.

Figures 7, 8:
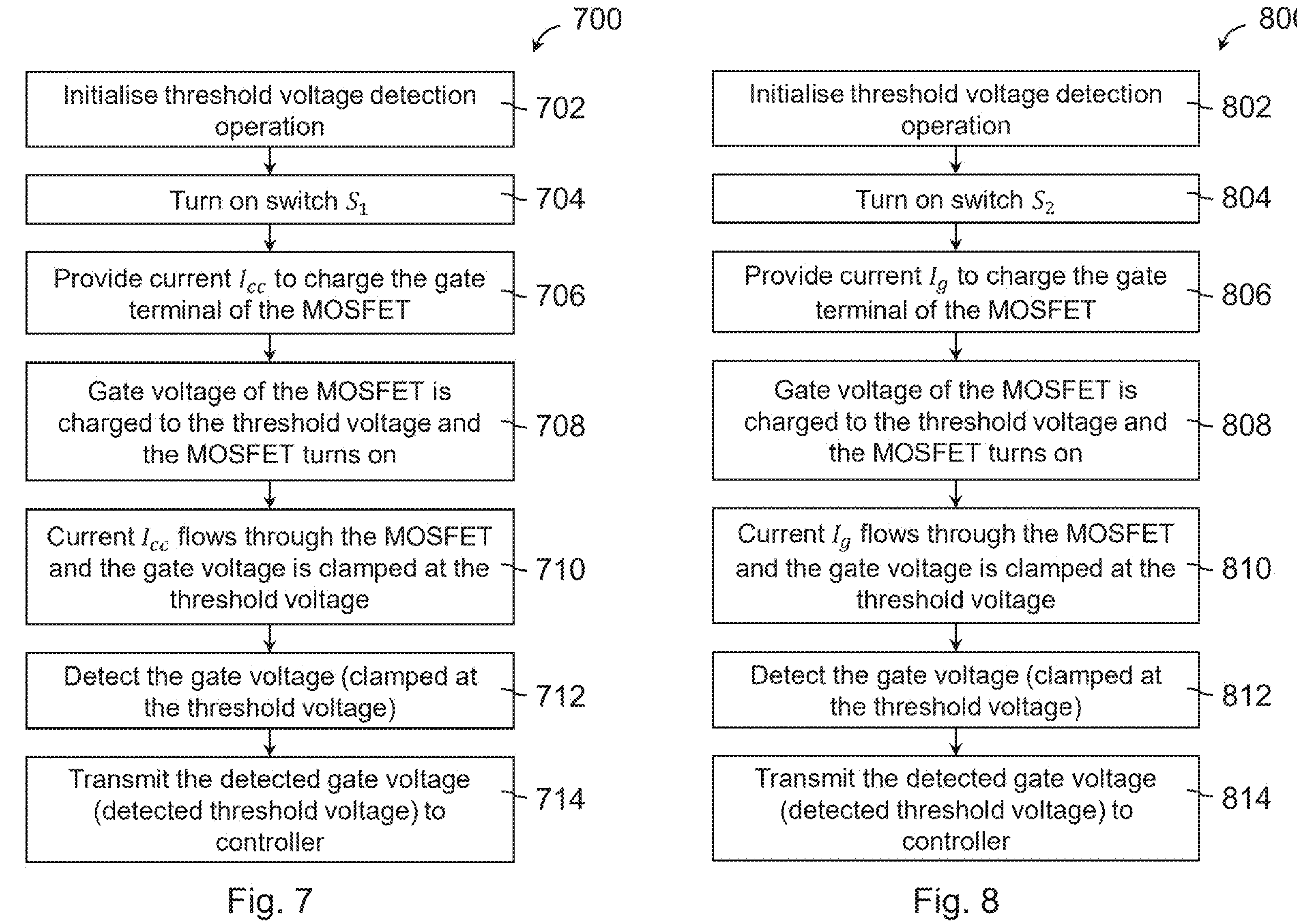
FIG. 7 is a flowchart illustrating an operation to detect a threshold voltage of the MOSFET in the circuit of FIG. 3 in one embodiment.
FIG. 8 is a flowchart illustrating an operation to detect a threshold voltage of the MOSFET in the circuit of FIG. 3 in one embodiment.

FIG. 7 illustrates an operation 700 for detecting the threshold voltage of the MOSFET 306 in one embodiment. The operation 700 is performed using the active gate driver 304 and the microcontroller 302.

The operation 700 includes, in 702, initialising the threshold voltage detection operation. The initialisation may be performed by the microcontroller 302 or the active gate driver 304. For example, the microcontroller 302 may provide an initialisation signal to the memory and logic control unit 3040. Then, in 704, the switch $S_1$ 3044 is turned on. For example, the memory and logic control unit 3040 may provide a signal to the switch 3044 to turn it on. The turning on of the switch 3044 electrically shorts the drain terminal and the gate terminal of the MOSFET 306. In 706, current from the current source $I_{cc}$ begins to flow to the MOSFET 306, via switch 3044, to charge the gate terminal of the MOSFET 306. Gate charge builds up on the gate terminal of the MOSFET 306, and this increases the gate voltage of the MOSFET 306. In 708, the gate voltage of the MOSFET 306 reaches the threshold voltage. Thus, a conducting channel is formed in the MOSFET 306 and the MOSFET 306 is turned on. After the MOSFET 306 turns on, in 710, current from the current source $I_{cc}$ flows through the conducting channel in the MOSFET 306 and the gate voltage is clamped at the threshold voltage (as the drain and gate terminals of the MOSFET are electrically shorted and the MOSFET is in diode mode). In 712, the gate voltage, which is clamped at the threshold voltage, is detected. This detection may be performed by the selector 3046 under the control of the memory and logic control unit 3040. For example, the memory and logic control unit 3040 may provide a signal to operate the selector 3046 to perform the detection. In 714, the detected gate voltage (the detected threshold voltage) is transmitted, e.g., from the selector 3046 to the microcontroller 302 via the ADC 3049 and terminal T7.

FIG. 8 illustrates another operation 800 for detecting the threshold voltage of the MOSFET 306 in one embodiment. The operation 800 is performed using the active gate driver 304 and the microcontroller 302.

The operation 800 includes, in 802, initialising the threshold voltage detection operation. The initialisation may be performed by the microcontroller 302 or the active gate driver 304. For example, the microcontroller 302 may provide an initialisation signal to the memory and logic control unit 3040. Then, in 804, the switch $S_2$ 3045 is turned on. For example, the memory and logic control unit 3040 may provide a signal to the switch 3045 to turn it on. The turning on of the switch 3045 electrically shorts the drain terminal and the gate terminal of the MOSFET 306. In 806, current from the current source $I_g$ of the gate drive unit 3041 begins to flow to the MOSFET 306, to charge the gate terminal of the MOSFET 306. Gate charge builds up on the gate terminal of the MOSFET 306, and this increases the gate voltage of the MOSFET 306. In 808, the gate voltage of the MOSFET 306 reaches the threshold voltage. Thus, a conducting channel is formed in the MOSFET 306 and the MOSFET 306 is turned on. After the MOSFET 306 turns on, in 810, current from the current source $I_g$ of the gate drive unit 3041 flows through the conducting channel in the MOSFET 306 and the gate voltage is clamped at the threshold voltage (as the drain and gate terminals of the MOSFET are electrically shorted and the MOSFET is in diode mode). In 812, the gate voltage, which is clamped at the threshold voltage, is detected. This detection may be performed by the selector 3046 under the control of the memory and logic control unit 3040. For example, the memory and logic control unit 3040 may provide a signal to operate the selector 3046 to perform the detection. In 814, the detected gate voltage (the detected threshold voltage) is transmitted, e.g., from the selector 3046 to the microcontroller 302 via the ADC 3049 and terminal T7. In one example, the current provided by the current source $I_g$ in operation 800 can be designed or changed by controlling the operation of the gate drive unit 3041 (e.g., by controlling the number of transistors that is turned on in the CMOS array of the gate drive unit 3041).

Figure 9:
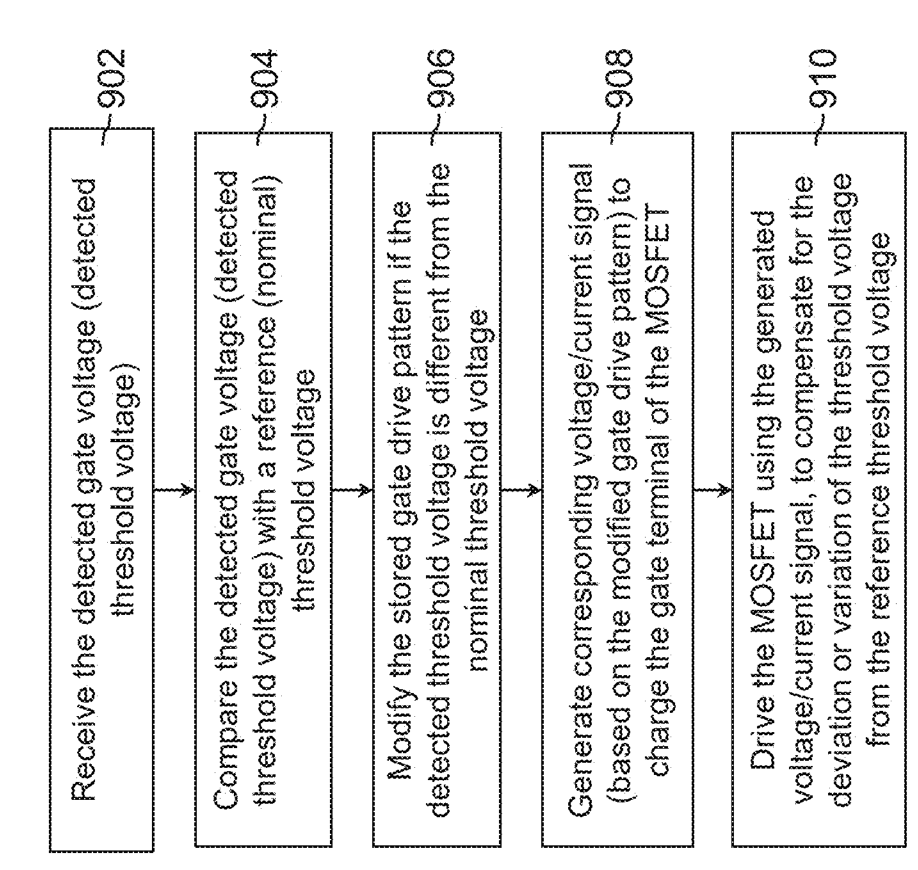
FIG. 9 is a flowchart illustrating an operation to compensate for a variation of a threshold voltage of the MOSFET in the circuit of FIG. 3 in one embodiment.

FIG. 9 is a flowchart illustrating an operation 900 for compensating a threshold voltage of the MOSFET 306 in one embodiment. The operation 900 is performed using the active gate driver 304 and the microcontroller 302. The operation 900 can performed after operation 700 or operation 800.

The operation 900 includes, in 902, receiving the detected gate voltage (the detected threshold voltage) at the microcontroller 302. In 904, the microcontroller 302 compares the detected gate voltage (the detected threshold voltage) with a reference (nominal or typical) threshold voltage for the MOSFET 306. The reference threshold voltage for the MOSFET 306 is stored in or otherwise accessible by the microcontroller 302. The microcontroller 302 generates and provides a signal to the memory and logic control unit 3040 based at least in part on the comparison. If the detected threshold voltage is the same as the reference threshold voltage, the signal provided by the microcontroller 302 is arranged to maintain (i.e., not modify) the gate drive pattern at the memory and logic control unit 3040. If the detected threshold voltage deviates or varies from the reference threshold voltage, the signal provided by the microcontroller 302 is arranged to modify the gate drive pattern at the memory and logic control unit 3040. In 906, if the detected threshold voltage deviates or varies from the reference threshold voltage, the memory and logic control unit 3040, based on the signal received from the microcontroller 302, modifies a stored gate drive pattern and provides the modified gate drive pattern to the gate drive unit 3041. The memory and logic control unit 3040 may select the gate drive pattern to be modified from multiple stored gate drive patterns based at least in part on a detected operation condition of the MOSFET 306 (e.g., drain current of the MOSFET 306 as detected by the detection circuit). In 908, the gate drive unit 3041 generates a corresponding drive signal (voltage/current signal) with shaped waveform based on the received gate drive pattern and provides the drive signal to the gate terminal of the MOSFET 306. In 910, the MOSFET 306 is driven using the corresponding drive signal (voltage/current signal), which compensates for the deviation or variation in the threshold voltage from the nominal threshold voltage.

In one example related to the modification of the gate drive pattern in 906, the memory and logic control unit 3040 may modify a selected gate drive pattern $[N_1, T_1, N_2, T_2, \ldots, N_n, T_n]$ to become a modified gate drive pattern $[N_1, T_1', N_2, T_2, \ldots, N_n, T_n]$, where the values of $T_1$ and $T_1'$ are different. The memory and logic control unit 3040 may provide the modified gate drive pattern $[N_1, T_1', N_2, T_2, \ldots, N_n, T_n]$ to the gate drive unit 3041.

In this example, the following equations are applicable to the charging of the gate terminal of the MOSFET 306 to the threshold voltage:

$$I_g = C_{iss} \times \frac{dV_{gs}}{dt}$$

$$V_{gs} = \frac{1}{C_{iss}} \int_0^t I_g \cdot dt = \frac{1}{C_{gs} + C_{gd}} \int_0^t I_g \cdot dt$$

where $I_g$ is the gate current of the MOSFET 306; $V_{gs}$ is the gate-source voltage of the MOSFET 306; $C_{iss}$ is the input capacitance of the MOSFET 306; $C_{gs}$ is the gate-source capacitance of the MOSFET 306; and $C_{gd}$ is the gate-drain capacitance of the MOSFET 306. The amplitude of the gate current $I_g$ corresponds to the value of N in the gate drive pattern. $C_{iss}$ ($=C_{gs}+C_{gd}$) is substantially constant before $V_{gs}$ reaches the threshold voltage.

$T_1$' can be calculated based on the deviation or variation of the detected threshold voltage $V_{th}$' from the reference threshold voltage $V_{th}$.

The turn-on delay time $t_d$ associated with the MOSFET 306 can be defined as the difference between time $t_0$, when the gate driver starts to output current/voltage, and time $t_1$, when the gate voltage $V_g$ of the MOSFET 306 reaches the threshold voltage.

In this example, the reference turn-on delay time $t_d$ can be obtained based on:

$$t_d' = t_1 - t_0 = \frac{(C_{gs} + C_{gd})V_{th}}{I_{g0}}$$

$I_{g0}$ is a constant gate current value corresponding to the value of $N_1$ in the gate drive pattern, and $V_{th}$ is the reference threshold voltage.

When a new threshold voltage $V_{th}$' (that deviates from the reference threshold voltage $V_{th}$) is detected in operation 700 or 800, the new turn-on delay time $t_d$' (that deviates from the reference turn-on delay time $t_d$) can be obtained based on:

$$t_d' = \frac{(C_{gs} + C_{gd})V_{th}'}{I_{g0}}$$

Hence, $T_1$' can be determined based on:

$$T_1' = T_1 + (t_d' - t_d).$$

In one embodiment, operations 700, 900 may be combined as one operation that is performed once or multiple times during operation of the active gate driver 304. In one example, the combined operation is performed continuously or periodically during operation of the active gate driver 304. In one embodiment, operations 800, 900 may be combined as one operation that is performed once or multiple times during operation of the active gate driver 304. In one example, the combined operation is performed continuously or periodically during operation of the active gate driver 304.

Embodiments of the invention include various unique features. For example, in some embodiments, an active gate driver is used to drive a power semiconductor device and in particular to detect and compensate the threshold voltage of the power semiconductor device. For example, in some embodiments, the detected threshold voltage is a highly accurate representation of actual threshold voltage of the power semiconductor device. For example, in some embodiments, there is provided more than one way to detect the threshold voltage (e.g., using a current source associated with a desaturation protection circuit and a switch, using a current source of the gate drive unit and a switch). In some embodiments, only one of these ways is implemented in the active gate driver. For example, in some embodiments, the threshold voltage is compensated in the same active gate driver by selecting and modifying the gate drive pattern stored in the memory. For example, in some embodiments, a one chip solution for detecting threshold voltage and compensating threshold voltage is provided.

Some embodiments address the problem of threshold voltage variation of the power semiconductor device by using an active gate driver specifically designed and configured to address such problem. Some example features of these embodiments include: (1) the threshold voltage of power semiconductor device can be readily and easily detected by the active gate driver; (2) the detected threshold voltage is an accurate representation of actual threshold voltage; (3) the threshold voltage can be detected using multiple different ways (i.e., has built-in redundancy); (4) the detected threshold voltage can be readily processed to modify the gate drive pattern(s) hence to adjust the threshold voltage (if the threshold voltage undesirably deviates or varies from a nominal threshold voltage), and/or (5) the modified gate drive pattern can compensate the threshold voltage deviation or variation. By compensating the variation or deviation in the threshold voltage of the power semiconductor device, the active gate driver can be applied for a wider range of devices or applications and can facilitate optimal/desired switching performance of the power semiconductor device.

In some embodiments, the active gate driver includes on-chip switch arrangement for online (real-time) detection and compensation of the threshold voltage $V_{th}$ in power semiconductor device such as MOSFET and IGBT.

The system, circuit, and gate driver embodiments may be applied in various applications such as power electronics converters including PFC, motor drive, or DCDC converter for electric vehicles, renewable energy systems, power grid, industrial applications, etc.

It will be appreciated by a person skilled in the art that variations and/or modifications (e.g., additions, omissions, substitutions, etc.) may be made to the described and/or illustrated embodiments to provide other embodiments. The described and/or illustrated embodiments should therefore be considered in all respects as illustrative, not restrictive.

Other features and aspects of the disclosure will become apparent by consideration of the detailed description and accompanying drawings. Any feature(s) described herein in relation to one aspect or embodiment may be combined with any other feature(s) described herein in relation to any other aspect or embodiment as appropriate and applicable. As used herein, term of degree such as "generally", "about", "substantially", or the like, are used, depending on context, to account for manufacture tolerance, degradation, trend, tendency, imperfect practical condition(s), etc.

The invention claimed is:

1. A gate driver for a power semiconductor device, comprising:

a detection circuit arranged to detect a threshold voltage of a power semiconductor device; and a gate drive circuit arranged to provide, based at least in part on the threshold voltage detected by the detection circuit, a drive signal to the power semiconductor device for operating the power semiconductor device, the drive signal having a waveform shaped to compensate for a deviation or variation of the threshold voltage from a nominal threshold voltage for the power semiconductor device.

2. The gate driver according to claim 1, wherein the gate drive circuit comprises:

a memory storing a gate drive pattern;

a control unit arranged to modify the gate drive pattern based at least in part on the threshold voltage detected by the detection circuit; and a gate drive unit arranged to generate the drive signal based at least in part on the gate drive pattern modified by the control unit and to provide the drive signal to the power semiconductor device.

3. The gate driver according to claim 2, wherein the control unit is arranged to control the detection circuit to facilitate detection of the threshold voltage of the power semiconductor device.

4. The gate driver according to claim 2, wherein the gate drive unit comprises a current source arranged to provide the drive signal.

5. The gate driver according to claim 2, wherein the gate drive unit comprises a voltage source arranged to provide the drive signal.

6. The gate driver according to claim 2, wherein the power semiconductor device comprises a gate terminal, a first terminal, and a second terminal;

wherein the threshold voltage substantially equals a minimum gate voltage required to create or provide a conducting channel between the first terminal and the second terminal;

wherein the gate driver further comprises a switch arrangement that is operable in a first state, to electrically connect the gate terminal of the power semiconductor device and the first terminal of the power semiconductor device such that the gate terminal of the power semiconductor device and the first terminal of the power semiconductor device are electrically shorted and to allow flow of current from a current source to the gate terminal of the power semiconductor device, and in a second state, to electrically disconnect the gate terminal of the power semiconductor device and the first terminal of the power semiconductor device such that the gate terminal of the power semiconductor device and the first terminal of the power semiconductor device are not electrically shorted and to prevent flow of current from the current source to the gate terminal of the power semiconductor device; and wherein the control unit is arranged to perform the following to facilitate detection of the threshold voltage of the power semiconductor device:

operate the switch arrangement in the first state to allow flow of current from the current source to the gate terminal of the power semiconductor device such that gate voltage of the power semiconductor device can reach the threshold voltage; and operate the detection circuit to detect a gate voltage of the power semiconductor device when the gate voltage of the power semiconductor device is at the threshold voltage.

7. The gate driver according to claim 6, wherein the control unit is further arranged to perform the following to facilitate detection of the threshold voltage of the power semiconductor device:

control or operate the current source to provide the flow of current to the gate terminal of the power semiconductor device.

8. The gate driver according to claim 6, wherein the gate drive unit comprises the current source.

9. The gate driver according to claim 6, wherein the gate driver further comprises:

a desaturation protection circuit arranged to provide short circuit protection for the power semiconductor device;

the desaturation protection circuit comprises the current source; and the current source is operable to provide current to a capacitor for preventing false fault triggering when a fault condition of the power semiconductor device is detected.

10. The gate driver according to claim 6, wherein the detection circuit comprises:

a first detector for detecting an electrical characteristic associated with the first terminal and/or the second terminal of the power semiconductor device, the electrical characteristic representing an operation condition of the power semiconductor device; and a second detector for detecting the gate voltage of the power semiconductor device.

11. The gate driver according to claim 10, wherein the memory stores a plurality of gate drive patterns; and wherein the control unit is arranged to select one gate drive pattern from the plurality of gate drive patterns based at least in part on the detected electrical characteristic associated with the first terminal and/or the second terminal of the power semiconductor device and to modify the one gate drive pattern based at least in part on the threshold voltage detected by the detection circuit; and wherein the gate drive unit is arranged to generate the drive signal based at least in part on the selected and modified gate drive pattern and to provide the drive signal to the power semiconductor device.

12. The gate driver according to claim 6, wherein the power semiconductor device comprises a metal oxide semiconductor field effect transistor (MOSFET), the first terminal is a drain terminal, and the second terminal is a source terminal.

13. The gate driver according to claim 6, wherein the power semiconductor device comprises an insulated gate bipolar transistor (IGBT), the first terminal is an emitter terminal, and the second terminal is a collector terminal.

14. An integrated circuit comprising the gate driver according to claim 1.

15. The integrated circuit according to claim 14, further comprising the power semiconductor device.

16. A system comprising:

the gate driver according to claim 1; and a controller operably connected with the gate driver;

wherein the detection circuit is arranged to provide the detected threshold voltage to the controller;

wherein the controller is arranged to compare the detected threshold voltage with the nominal threshold voltage and to provide, based at least in part on the comparison, a signal to the gate drive circuit; and wherein the gate drive circuit is arranged to provide the drive signal based at least in part on the signal received from the controller.

17. The system according to claim 16, wherein the controller is arranged to provide an initiation signal to the gate drive circuit to initiate detection of the threshold voltage of the power semiconductor device.

18. The system according to claim 16, further comprising:

the power semiconductor device operably connected with the gate driver.

19. A method for controlling operation of a power semiconductor device, the method comprising:

detecting, using a gate driver, a threshold voltage of a power semiconductor device; and providing, using the gate driver and based at least in part on the detected threshold voltage, a drive signal to the power semiconductor device for operating the power semiconductor device, the drive signal having a waveform shaped to compensate for a deviation or variation of the threshold voltage from a nominal threshold voltage for the power semiconductor device.

20. The method according to claim 19, further comprising:

modifying a gate drive pattern stored in a memory of the gate driver based at least in part on the detected threshold voltage; and generating, at the gate driver, the drive signal based at least in part on the modified gate drive pattern.

* * * * *